VAPOR DEPOSITION ONTO STACKED SEMICONDUCTOR WAFERS FOLLOWED BY PARTICULAR COOLING

Filed June 27, 1962

3,140,965

VAPOR DEPOSITION ONTO STACKED SEMICONDUCTOR WAFERS FOLLOWED BY PARTICULAR COOLING

Konrad Reuschel, Pretzfeld, Germany, assignor to Siemens-Schuckertwerke Aktiengesellschaft, Berlin-Siemensstadt, Germany, a corporation of Germany Filed June 27, 1962, Ser. No. 205,740
Claims priority, application Germany July 22, 1961
9 Claims. (Cl. 148—175)

Figures 1, 2:
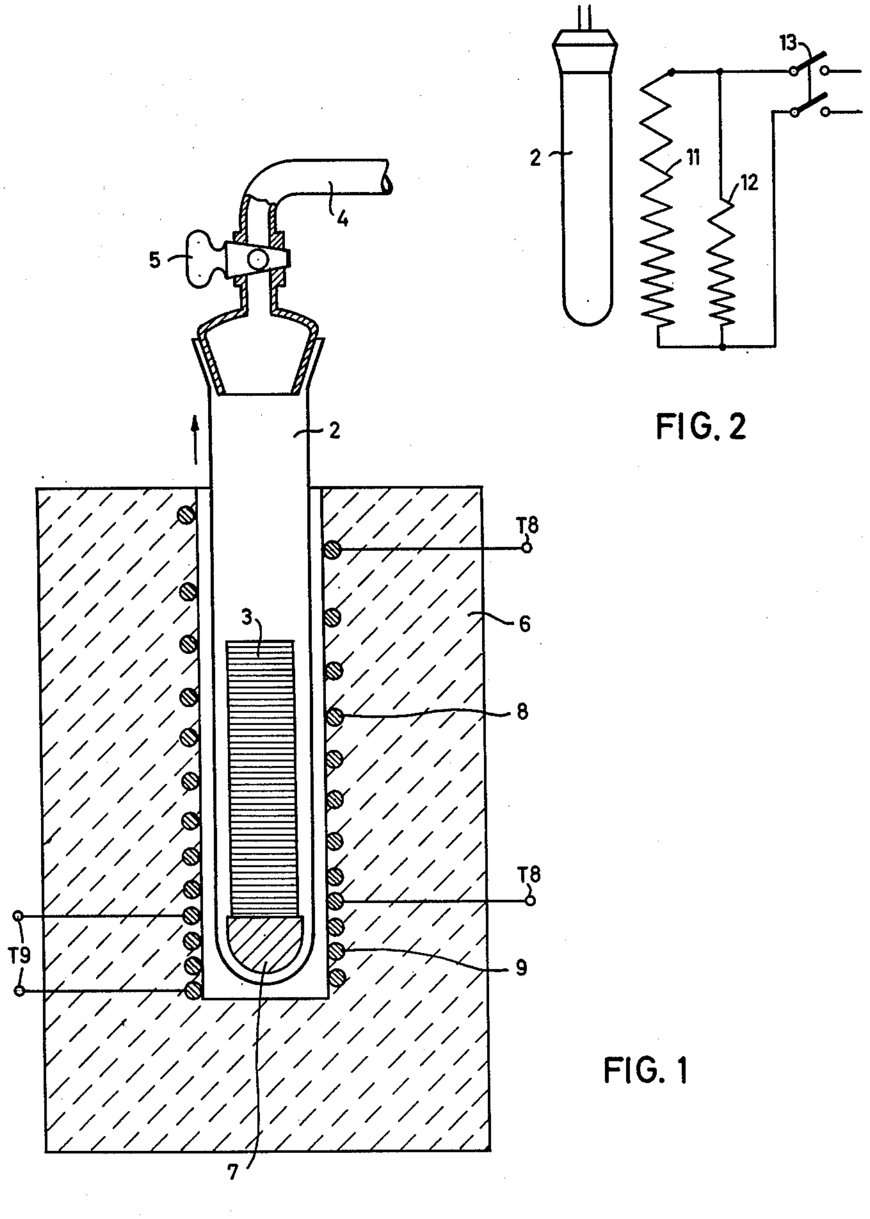

My invention relates to methods of producing electronic semiconductor devices having a monocrystalline semiconductor body with two or more layers of different electric conductance properties, namely respectively different types of conductance or respectively different dopant concentration and hence ohmic resistance. In a more particular aspect my invention relates to the production of such devices, preferably those of the p-n junction type, by precipitation of semiconductor substance in monocrystalline constitution from a gaseous halogen compound of the substance onto a substratum or carrier member of semiconductor material having the same, or substantially the same, crystalline lattice structure.

There is a known method of producing a germanium layer upon a germanium substratum according to which a germanium carrier body is mounted in a processing vessel and subjected to a flow of germanium halogen compound while the vessel and its contents are heated to a temperature at which the halogen compound becomes thermally dissociated (German Patent 865,160). Used in this method is germanium iodide which is produced by passing hydrogen over heated iodine and then passing the resulting hydrogen iodide over a quantity of germanium kept at 410° to 460° C. The evolving germanium iodide is subsequently passed over the heated germanium carrier bodies where it becomes thermally dissociated so that a layer of germanium is deposited upon the carrier bodies. By adding dopant impurities, p-n junctions can be produced. The impurity can be added to the hydrogen gas employed for producing the reaction gas and for driving it through the processing vessel, or the impurity may be contained in the germanium quantity serving for the production of the germanium iodide.

Similar methods of producing layers of different electric conductance properties upon a semiconductor substratum by precipitation from the gaseous phase have also become known for silicon.

Relating to precipitation methods generally of the above-mentioned kind, it is an object of my invention to improve these methods from the viewpoint of industrial production by affording a simultaneous manufacture of a larger number of individual semiconductor units than could heretofore be produced satisfactorily in a single operation.

Another object of my invention is to achieve such an increase in simultaneously producible semiconductor devices while requiring for this purpose a particularly small amount of equipment distinguished by utmost simplicity and reliability of operation.

Still another object of my invention is to render the large-scale production of the semiconductor units more economical by improving the yield of the semiconductor substance being used so that virtually all of the substance introduced into the equipment in gaseous form is recaptured as precipitated layer upon the semiconductor devices being produced.

To achieve these objects, and in accordance with a feature of my invention, I place a multiplicity of semiconductor plate or disc members upon each other in a processing vessel so as to form an axially elongated, rod-shaped stack, the members thus being stacked having alternately different electric properties such as different types of conductance, for example alternately p-type and n-type conductance, or having alternately different dopant concentration and correspondingly different ohmic resistance. The stacked plate members consist of respective monocrystals and have the same or substantially the same lattice constitution as the semiconductor substance that is to form one or more layers upon the substrata formed by the members. Preferably, the electrically different plate members stacked upon each other consist of the same semiconductor substance as the one to be precipitated. Thus the members may consist of silicon when silicon is to be precipitated, or they consist of germanium if germanium is to be precipitated thereupon. The stack thus constituted is further subjected in the reaction vessel to a reaction gas which contains a halogen compound of the semiconductor substance to be precipitated, preferably in mixture with a carrier gas such as hydrogen. In the presence of the reaction gas, the stack is heated to the dissociation and precipitation temperature of the halogen compound, thus causing the dissociated semiconductor substance to precipitate upon the substratum members. Under these conditions, I further subject the heated stack of members to a temperature gradient or temperature drop from one end of the stack toward the other.

According to another feature of my invention, the above-described heating and temperature graduating steps are being performed while the processing vessel, with the stack and a given quantity of reaction gas contained therein, is sealed from the ambient atmosphere, so that the amount of semiconductor substance precipitating from the gas is limited and predetermined by the quantity originally contained in the gas.

It has been found that by proceeding in this manner, a transport reaction takes place which causes semiconductor material to be transported from the hotter to the colder semiconductor discs or in the reverse direction, the impurities migrating together with the semiconductor material with the result of producing precipitated layers of a conductance type or dopant concentration differing from the corresponding properties of the respective substrata.

One way of producing the above-mentioned temperature gradient in the stack is to heat the entire stack of semiconductor plate members uniformly in a furnace and thereafter pulling the processing vessel with the stack slowly out of the furnace, thus permitting the vessel and its content to gradually cool down to normal room temperature.

The invention will be further described with reference to embodiments which are indicative, by way of example, of further details and advantages of the method.

Schematically illustrated on the drawing by a sectional view is a device for performing the method according to the invention.

An elongated tubular processing vessel 2 of quartz, closed at its bottom, contains a stack 3 composed of circular plates of semiconductor material. In the example here described, the plate members of the stack consist alternately of p-type and n-type silicon. They have a diameter of from 18 mm. and a thickness of about 200 microns. The p-type plates have a specific resistance of 500 ohm·cm. and are doped with boron. The n-type plates have a resistance of 100 ohm·cm. and are doped with arsenic. The quartz tube 2 has an inner diameter of 20 mm. and is 30 cm. long. The stack may comprise about 500 individual plate members on top of each other.

The silicon plates, prior to stacking them together, are lapped, etched and chemically polished. The etching can be done in the conventional manner by immersing the plates for a few seconds into a commercial CP etching solution. The subsequent polishing is effected preferably by using a mixture of 40% hydrofluoric acid with fuming nitric acid in 1:1 ratio.

The quartz tube 2 has a widened neck internally ground and polished so that it can be gas-tightly sealed by a plug which is joined with a connecting pipe 4 through which the quartz tube 2 is first evacuated and thereafter filled with the processing gas. A stop cock 5 permits closing the connecting tube 4.

The major portion of the tubular processing vessel 2 is stuck into the vertical heating space of an electric furnace 6, the entering depth of the vessel being sufficient to include all of the stack 3. The furnace is preferably electrically heated, for example by an electric resistance heater. However, the heating may also be effected by an induction heater. Shown on the drawing is a main heater winding 8 connected to terminals T8, and an auxiliary resistance heater 9 connected to terminals T9. The winding 8 may consist of a resistance winding or an induction winding. If this winding is to be energized by high-frequency current for the purpose of induction heating, it is preferable to provide the furnace with another heat source in order to preheat the stack which in cold condition is extremely high ohmic and would not initially conduct sufficient electric current for induction heating. The resistance heater 9 is available for such preheating. After preheating the induction heating can become rapidly effective. It is further preferable to provide a relatively large piece of silicon 7 at the bottom of the quartz tube 2 to serve as a support for the stack 3 and also for preheating purposes.

The method is performed as follows. A vacuum pump is connected through pipe 4 to the tubular vessel 2, and the vessel is evacuated. Thereafter a silicon halogen compound is supplied to the vessel, for example silico-chloroform or silicon tetrachloride. It is preferable to employ a mixture of the silicon halogen compound with hydrogen, for example silicochloroform and hydrogen in a ratio of 1:12. The quantity of halogen compound thus admitted to the quartz tube is such that after closing the stop cock 5, a vessel temperature of about 1100° C. causes the pressure in the processing space to be approximately equal to atmospheric pressure. Of course, other halogen compounds can also be employed, for example bromides or iodides of silicon. In the case of germanium, the corresponding germanium compounds are applicable in exactly the same manner.

After filling the processing vessel with the reaction gas, the vessel is sealed by means of stop cock 5 or is fused off, and the content of the vessel is then heated to a temperature of about 1200° C. Thereafter, the quartz tube 2 is pulled upwardly out of the furnace 6 at a rate less than 5 mm. per minute. A rate of about 0.5 mm. per minute is preferably employed.

During the outward travel of the quartz tube, the heating by the furnace remains effective. As the quartz tube leaves the furnace, the upper end of the stack 3 cools first so that the desired temperature gradient, with a high temperature at the bottom of the stack and the lowest temperature at the top, is brought about in this manner, thus causing the above-mentioned transport reaction to occur. As a result, semiconductor material is eliminated from the top side of the individual plate members within the stack and is preferably deposited at the bottom side of the adjacent plate member. The thickness of the precipitated layers depends upon the temperature gradient and the duration of the reaction and consequently is essentially dependent upon the rate at which the quartz tube 2 is moved out of the furnace. Hence, the thickness of the precipitated layers can be controlled and regulated by correspondingly controlling the rate of movement. If desired, the performance can be repeated two or more times, thus increasing the thickness of the precipitated layers to the desired extent.

The above-described phenomena occur, as the case may be through intermediate stages, in accordance with the following formulas:

$$Si + SiCl_4 \xrightarrow{1200^\circ\ C.} 2SiCl_2$$

$$2SiCl_2 \xrightarrow{1150^\circ\ C.} Si + SiCl_4$$

Analogous formulas apply to the corresponding iodides and bromides. For example, it suffices to introduce into the quartz tube 2 a small quantity of iodine which forms gaseous iodides with silicon or germanium already at lower temperatures at which the transport reaction according to the foregoing formulas can take place.

Also applicable is another way of proceeding according to which the transportation takes place from the colder to the hotter semiconductor plate, for example as expressed by the following formulas:

$$Si + 4HCl \xrightarrow{1100^\circ\ C.} SiCl_4 + 2H_2$$

$$SiCl_5 + 2H_2 \xrightarrow{1150^\circ\ C.} Si + 4HCl$$

For proceeding in this manner, the temperature gradient must be produced within the furnace 6, for example by correspondingly winding the resistance heater or the induction heater coil. After precipitation has taken place, a "freezing" of the condition then reached can be obtained by suddenly deenergizing the electric furnace as, for example by opening the furnace switch.

On another test run, twelve semiconductor bodies, having a disc thickness of about 300 to 400$\mu$ and a diameter of about 18 mm., were stacked upon each other. The length of the stack was about 10 mm. A temperature gradient of 60 centigrade degrees, namely from 1190° C. to 1130° C., was produced from one end of the stack to the other, within the furnace. The surrounding atmosphere consisted of silicon tetrachloride $SiCl_4$ and hydrogen in the ratio 1:20. Under these conditions a transport of semiconductor material occurred producing, per minute, a layer thickness of 1$\mu$.

An essential item was the fact that the surrounding atmosphere in the enclosed space did not contain oxygen, nitrogen or water, which otherwise would result in the formation of oxides and nitrides at the surface of the semiconductor bodies resulting in masking effects, thereby producing a non-uniform removal and precipitation of material.

The following advantages of the method will readily be apparent from the embodiments described in the foregoing. In the first place, a rather large number of semiconductor devices can be fabricated simultaneously in a single operation. The method is particularly economical by virtue of the fact that practically the entire semiconductor substance introduced by means of the reaction gas into the processing vessel is actually utilized in form of precipitation. Furthermore, the equipment needed for the method is extremely simple and occupies little space, particularly in view of the large number of devices produced simultaneously.

Small spacers, for example quartz crystals, can be interposed between the individual member plates of the stack 3 in order to maintain adjacent plates spaced from each other. At those individual localities where the quartz granules or quartz sand touches the surface of the semiconductor material, the precipitated layer will exhibit some fault or disturbance. It is therefore preferable to subdivide the semiconductor devices produced in this manner. The subdivision can be effected by scratching and then breaking the individual plates in order to thereafter discard the faulty fragments.

If desired, auxiliary holders may be inserted into the quartz tube. Such holders may also consist of quartz, for example, and can be given the design required to keep the individual plate members spaced from each other. Suitable holders for this purpose are disclosed in my copending application Serial No. 200,525, filed on June 6, 1962, and based on German priority S 74266 VIIIc/21g.

For special purposes, for example in the production of semiconductor devices requiring a particular shape of the electrodes to be attached to the semiconductor bodies, it is of advantage to place masks between the individual semiconductor plates of the stack in order to cover those areas in which no precipitation is to take place. Such masks may consist, for example, of mica, graphite, molybdenum, tantalum or the like.

I claim:

1. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different respective conductance properties upon each other to form an axially elongated stack, said members, consisting of semiconductor monocrystals of substantially the same lattice structure as the semiconductor substance to be precipitated; subjecting the stack in the vessel to a reaction gas which contains a halogen compound of semiconductor substance to be precipitated; heating the stack in the presence of the reaction gas to a temperature at which the semiconductor substance is precipitated from the halogen compound, and producing a temperature gradient from one to the other end of the stack with the higher temperature near the bottom of the stack.

2. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different types of conductance upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the stack in the presence of the reaction gas to a temperature at which the semiconductor substance is precipitated from the halogen compound, and producing a temperature gradient from one to the other end of the stack with the higher temperature near the bottom of the stack.

3. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different dopant concentrations upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the stack in the presence of the reaction gas to a temperature at which the semiconductor substance is precipitated from the halogen compound, and producing a temperature gradient from one to the other end of the stack with the higher temperature near the bottom of the stack.

4. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different respective conductance properties upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the stack in the presence of the reaction gas to a temperature at which the semiconductor substance is precipitated from the halogen compound, and producing a temperature gradient from one to the other end of the stack with the higher temperature near the bottom of the stack; reheating the stack in the presence of the reaction gas to the temperature at which the semiconductor substance is precipitated from the halogen compound and producing a temperature gradient from one end of the stack to the other in the same direction as previously produced.

5. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different respective conductance properties upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated, heating the entire vessel with the stack therein to substantially uniform temperature and thereafter progressively cooling the stack from top to bottom.

6. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different respective conductance properties upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the entire vesssel to substantially uniform temperature, with the stack enclossed, in a furnace and thereafter pulling the vessel out of the furnace in the direction of the stack axis.

7. The precipitation method of producing electronic semiconductor devices having a monocrystalline semiconductor body with a plurality of monocrystalline layers of respectively different electric conductance properties, which comprises stacking in a sealable vesssel a multiplicity of plate members having alternately different respective conductance properties upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the entire vessel, with the stack enclosed, in a furnace to substantially uniform temperature and thereafter pulling the vessel out of the furnace in the direction of the stack axis at a rate of less than 5 mm. per minute.

8. The precipitation method of producing electronic semiconductor devices having a monocrystalline semiconductor body with a plurality of monocrystalline layers of respectively different electric conductance properties, which comprises stacking in a sealable vessel a multiplicity of plate members having alternately different respective conductance properties continuously upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the stack in the presence of the reaction gas to a temperature at which the semiconductor substance is precipitated from the halogen compound, and producing a temperature gradient from one to the other end of the stack with the higher temperature near the bottom of the stack.

9. The precipitation method of producing electronic semiconductor devices having a monocrystalline semiconductor body with a plurality of monocrystalline layers of respectively different electric conductance properties, which comprises stacking in a sealable vessel a multiplicity of plate members; inserting quartz granules between the adjacent members, said plate members having alternately different respective conductance properties upon each other to form an axially elongated stack, said members consisting of semiconductor monocrystals of substantially the same lattice structure as the semiconductor substance to be precipitated; subjecting the stack in the vessel to a reaction gas which contains a halogen compound of semiconductor substance to be precipitated; heating the stack in the presence of the reaction gas to a temperature at which the semiconductor substance is precipitated from the halogen compound, and producing a temperature gradient from one to the other end of the stack with the higher temperature near the bottom of the stack.

References Cited in the file of this patent

UNITED STATES PATENTS 2,817,799 Jenny ---------------- Dec. 24, 1957

OTHER REFERENCES

Marinace: "Epitaxial Vapor Growth of Ge Single Crystals in a Closed-Cycle Processs," I.B.M. Journal of Research and Development, vol. 4, No. 3, July 1960, pp. 248–255.